US009953726B1

(12) United States Patent
Irby et al.

(10) Patent No.: US 9,953,726 B1
(45) Date of Patent: Apr. 24, 2018

(54) FAST QUASI-PARITY CHECKER FOR CORRELATED ELECTRON SWITCH (CES) MEMORY ARRAY

(71) Applicant: ARM Limited, Cambridge (GB)

(72) Inventors: Joel Thornton Irby, Austin, TX (US); Mudit Bhargava, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/361,789

(22) Filed: Nov. 28, 2016

(51) Int. Cl.
*G11C 7/00* (2006.01)
*G11C 29/50* (2006.01)
*G11C 13/00* (2006.01)

(52) U.S. Cl.
CPC .... *G11C 29/50008* (2013.01); *G11C 13/0069* (2013.01); *G11C 13/0097* (2013.01)

(58) Field of Classification Search
None
See application file for complete search history.

(56) References Cited

U.S. PATENT DOCUMENTS

| | | | | |
|---|---|---|---|---|
| 5,481,499 A * | 1/1996 | Meyer | ................... | G11C 29/02 365/201 |
| 7,282,928 B1 * | 10/2007 | Hladky | ................. | G01N 17/02 204/404 |
| 2005/0122767 A1 * | 6/2005 | Perner | ................... | G11C 11/16 365/158 |
| 2006/0102476 A1 * | 5/2006 | Niwa | ................. | G01N 27/4067 204/425 |
| 2011/0134676 A1 * | 6/2011 | Breitwisch | ......... | G11C 13/0004 365/49.1 |
| 2015/0287460 A1 * | 10/2015 | Lee | .................... | G11C 13/0069 365/148 |
| 2015/0348624 A1 * | 12/2015 | Jang | .................... | G11C 13/004 365/148 |
| 2016/0180960 A1 * | 6/2016 | Lee | ....................... | G11C 17/16 711/125 |
| 2017/0045905 A1 | 2/2017 | Sandhu et al. | | |
| 2017/0047919 A1 | 2/2017 | Sandhu et al. | | |

* cited by examiner

*Primary Examiner* — Harry W Byrne
*Assistant Examiner* — Sultana Begum
(74) *Attorney, Agent, or Firm* — Leveque IP Law, P.C.

(57) ABSTRACT

An apparatus is provided for testing storage elements that include a variable impedance element switchable between a first impedance state and a second impedance state. The apparatus includes an interconnect circuit for coupling storage elements in a selected arrangement. The apparatus includes an impedance sensing circuit operable to measure at least a resistive component of an impedance of the coupled storage elements and a test controller operable to configure the interconnect circuit and initiate measurement of the combined impedance of the coupled storage elements by the impedance sensing circuit. The impedance sensing circuit compares the measured impedance with at least a resistive component of an expected impedance. The storage elements and apparatus may form part of an integrated circuit. A storage element may include a correlated electron switch, for example.

23 Claims, 13 Drawing Sheets

FAST QUASI-PARITY CHECKER FOR CORRELATED ELECTRON SWITCH (CES) MEMORY ARRAY

TECHNICAL FIELD

The present disclosure relates the testing of an electronic memory array based on impedance elements such as correlated electron switches.

BACKGROUND

A memory array may be tested by checking if memory cells of the array can be both set to logical-1 and reset to logical-0. One method of testing writes values to a row of an array and then reads the values back. The parity of the written values is compared with the parity of the read values. A difference in parities indicates a failure of one or more memory cells. However, the method fails when an even number of bits are in error (flipped).

A memory cell may be constructed using an element with a variable impedance. An example is a cell that utilizes Correlated Electron Material (CEM) in a Correlated Electron Switch (CES). Correlated Electron Material (CEM) exhibits an abrupt transition from a conductive/low impedance state to an insulative/high impedance state, the transition arising from electron correlations in a material, rather than from solid state structural phase changes.

DETAILED DESCRIPTION OF THE EMBODIMENTS

Figure 1:
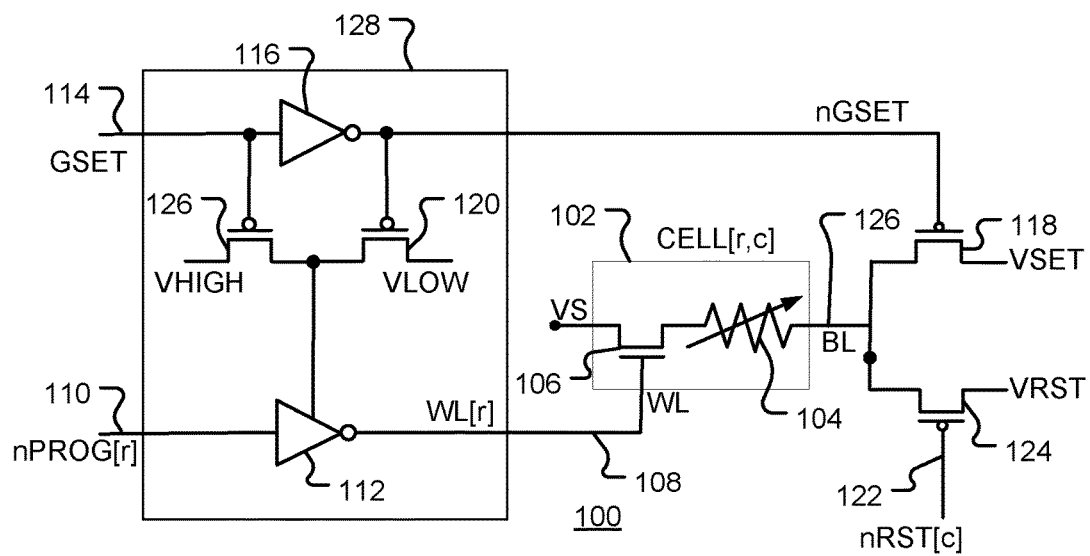
FIG. 1 is a simplified diagram of a single bitcell of a CeRAM memory array together with circuitry for programming the bitcell, in accordance with embodiments of the disclosure.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," "substantially," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

As utilized herein, the terms "coupled", "connected," and/or similar terms are used generically. It should be understood that these terms are not intended as synonyms. Rather, "connected" is used generically to indicate that two or more components, for example, are in direct physical, including electrical, contact; while, "coupled" is used generically to mean that two or more components are potentially in direct physical, including electrical, contact; however, "coupled" is also used generically to also mean that two or more components are not necessarily in direct contact, but nonetheless are able to co-operate and/or interact. The term "coupled" is also understood generically to mean indirectly connected, for example, in an appropriate context.

The various embodiments and examples of the present disclosure as presented herein are understood to be illustrative of the present disclosure and not restrictive thereof and are non-limiting with respect to the scope of the present disclosure.

Further particular and preferred aspects of the present disclosure are set out in the accompanying independent and dependent claims. Features of the dependent claims may be combined with features of the independent claims as appropriate, and in combinations other than those explicitly set out in the claims.

The present disclosure relates to an apparatus for detecting storage elements that cannot be set/reset. Examples of storage elements include cells of a memory array, flip-flops, latches, etc. For example, the apparatus and corresponding method have application to a memory array that uses cells based on variable or switchable impedance. An example is a cell that utilizes Correlated Electron Material (CEM) in a Correlated Electron Switch (CES). Correlated Electron Material (CEM) exhibits an abrupt transition from a conductive/low impedance state to an insulative/high impedance state, the transition conductive/insulative state transition arising from electron correlations in a material. A further example is a cell in which resistance is varied as a result of solid state structural phase changes. In such memory cells, a high resistance/impedance state may indicate a logical-0 and a low resistance/impedance state may indicate a logical-1, or vice versa, for example.

In accordance with certain embodiments, all cells in one or more columns are connected, either in a series or in a parallel arrangement. Deviation of an overall electrical property of the arrangement, such as its resistance or impedance, from an expected value is indicative of the presence of one or more cells that are not programmed to the expected state.

Some embodiments described below relate to the testing of a Random Access Memory comprising an array of Correlated Electron Switches. Such an array is referred to as a Correlated electron Random Access Memory (CeRAM). However, it will be apparent to those of ordinary skill in the art that the disclosed techniques have application to memory arrays based on other technologies such as resistive random access memory (RRAM) and the like.

Correlated electron material (CEM) may be used to form a correlated electron switch (CES), which in turn may be used to form a memory cell and/or logic device. The memory cells may be arranged in an array to form a Correlated electron Random Access Memory (CeRAM). In this context, a CES may exhibit a substantially abrupt high/low impedance transition arising from electron correlations rather than solid state structural phase changes (e.g., crystalline/amorphous in phase change memory (PCM) devices or filamentary formation and conduction in resistive RAM devices). In one aspect, a substantially abrupt conductor/insulator transition in a CES may be responsive to a quantum mechanical phenomenon, in contrast to melting/solidification or filament formation, for example. Such a quantum mechanical transition between conductive and insulative states, and/or between first and second impedance states, in a CES may be understood in any one of several aspects. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

In an aspect, a quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_C)^{1/3}a \approx 0.26$, where $n_C$ is a concentration of electrons and "a" is the Bohr radius. When a critical carrier concentration is achieved such that the Mott criteria is met, the Mott transition will occur and the state of the CES will change from a higher resistance/higher capacitance state (that is, an insulative/higher impedance state) to a lower resistance/lower capacitance state (that is, a conductive/lower impedance state).

In another aspect, the Mott transition is controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

Further, switching from an insulative/higher impedance state to a conductive/lower impedance state may bring about a change in capacitance in addition to a change in resistance. For example, a CES may include the property of variable resistance together with the property of variable capacitance. That is, impedance characteristics of a CES device may include both resistive and capacitive components. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance.

A CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. A CEM may comprise one or more transition metal oxides, one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

A CES device may comprise CEM sandwiched between conductive terminals to form a variable impeder device. As utilized herein, the terms "correlated electron switch" and "variable impeder" may be interchangeable. At least in part through application of a critical voltage and a critical current between the terminals, the CEM may transition between the aforementioned conductive/lower impedance state and insulative/higher impedance state. As mentioned, CEM in a variable impeder device may transition between a first impedance state and a second impedance state due to a quantum mechanical transition of the correlated electron switch material as a result an applied critical voltage and an applied critical current, as described in more detail below. Also, as mentioned above, a variable impeder device may exhibit properties of both variable resistance and variable capacitance.

In a particular embodiment, a variable impeder device, such as a CES device, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. An impedance state of a CES device may be detected based, at least in part, on a signal detected on terminals of the CES device in a read and/or sense operation. In another particular embodiment, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

An example CES/variable impeder device may comprise characteristics of both variable resistance and variable capacitance. While a variable impeder device may comprise a substantially homogenous CEM an equivalent circuit for a variable impeder device may comprise a variable resistor in parallel with a variable capacitor.

Table 1 below depicts an example truth table for an example variable impeder device, such as a CES device.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

A resistance of a variable impeder device may transition between a lower resistance state and a higher resistance state that is a function, at least in part, of a voltage $V_{applied}$ applied across the CEM. A resistance of a lower resistance state may be 10-100,000 times lower than a resistance of a higher resistance state, although claimed subject matter is not limited in scope in this respect. Similarly, a capacitance of a variable impeder device may transition between a lower capacitance state, which for an example embodiment may comprise approximately zero, or very little, capacitance, and a higher capacitance state that is a function, at least in part, of a voltage applied across the CEM. Also, as seen in Table 1, a variable impeder device transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

Various exemplary embodiments are described below in which a storage element includes a resistive element, which may be any element, or collection of elements, the electrical impedance of which has a resistive component. However, the invention is not so limited. The storage element may be any element having one or more programmable electrical properties. For example, a storage element may be a programmable impeder, as discussed above, for which both resistive and reactive components of the impedance may be programmed. A CES, for example, may be a variable impeder that is programmable between a low resistance/low capacitance state and a high resistance/high capacitance state.

Certain embodiments relate to an apparatus, such as an integrated circuit, for testing a memory array or other set of storage elements. For example, an integrated circuit may include an interconnect circuit for coupling bitcells of a memory array in a parallel arrangement or a series arrangement, where a bitcell comprises a resistive element switchable between a high resistance state and a low resistance state. The integrated circuit includes a resistance sensing circuit operable to measure a combined electrical resistance of the coupled bitcells and a test controller operable to configure the interconnect circuit and initiate measurement of the combined electrical resistance of the coupled bitcells. The resistance sensing circuit is further operable to compare the measured combined electrical resistance with an expected combined electrical resistance of the coupled bitcells. The memory array may form part of the integrated circuit. The bitcells in the parallel arrangement are programmed to an expected high resistance state and the bitcells in the series arrangement are programmed to an expected low resistance state.

The integrated circuit of may also include a circuit configured to program the memory array to a selected resistance state of the high and low resistance states in response to a global set signal or a global reset signal.

A resistive element of a bitcell may include a correlated electron switch (CES) or may be based on some other switchable resistance.

The array may include one or more spare columns of bitcells, in which case the interconnect circuit is further operable to couple to bitcells of the one or more spare columns.

The interconnect circuit may include a number of analog switches.

The test controller may be further operable to control a number of word lines of the memory array to enable selection or deselection of one or more rows of bitcells of the array.

The resistance sensing circuit may include one or more reference resistors.

Instructions of a hardware description language representative of the integrated circuit may be stored on a non-transient computer readable medium.

In accordance with certain embodiments, a method is provided for testing an array of bitcells, a bitcell of the array comprising a resistive element designed to be set to low resistance state by application of first programming signals and designed to be reset to a high resistance state by application of second programming signals. The method includes testing a row of bitcells of the array by applying first programming signals to at least the row of bitcells in the array, coupling the row of bitcells in a series arrangement, the series arrangement having a first expected resistance, measuring an electrical resistance of the series arrangement, comparing the first measured electrical resistance to the expected resistance of the series arrangement, and determining the row of bitcells to be failed if the measured resistance of the series arrangement exceeds the first expected resistance by greater than a first threshold value. The method also includes testing a column of bitcells of the array by applying second programming signals to at least a column of bitcells in the array, coupling the column of bitcells in a parallel arrangement, the parallel arrangement having a second expected resistance, measuring an electrical resistance of the parallel arrangement, comparing the measured electrical resistance of the parallel arrangement to the second expected resistance, and determining the column of bitcells to be failed if the expected resistance of the parallel arrangement exceeds the measured resistance by greater than a second threshold value.

When the row of bitcells is determined to be failed, a number of iterations may be performed where an iteration comprises bypassing one or more bitcells in the row of bitcells, retesting the row of bitcells, and determining a bitcell of the one or more bypassed bitcells in the row of bitcells to be failed if the retested row is not determined to be failed.

When the column of bitcells is determined to be failed a number of iterations may be performed where an iteration comprises controlling word lines of the memory array to deselect one or more bitcells in the column of bitcells, retesting the column of bitcells, and determining a bitcell of the one or more deselected bitcells in the column of bitcells to be failed if the retested column is not determined to be failed.

Coupling the row of bitcells in the series arrangement or coupling the column of bitcells in the parallel arrangement may be performed by configuring one or more switches of an interconnect circuit.

The first programming signals and the second programming signals may be applied simultaneously to all bitcells in the array.

A row or column of the array containing a bitcell determined to the failed may be replaced with a spare row or column.

FIG. 1 is a simplified diagram of a circuit 100 showing an example of single bitcell 102 of a CeRAM array together with a programming circuit for programming the bitcell. The bitcell 102 includes a Correlated Electron Switch (CES) 104 in series with transistor 106. The transistor 106 is a device that controls electrical current through the CES 104 and is controlled by a control signal applied on line 108 to a control terminal (such as a gate) of the transistor 106. Since current flow is used both for reading and writing, the control signal may also be used to deselect bitcell 102 by controlling transistor 106 to prevent current flow. A bitcell is an element that can store a single binary digit (bit), i.e. a logical-0 or a logical-1.

Bitcells may be arranged in an array having N rows and M columns in which, for example, each row corresponds to a data word and each column corresponds to a bit position in a word. Line 108 may be connected to all bitcells in row r, say, and hence will be referred as a Word Line and denoted as WL[r].

The bitcell 102 can be programmed to a High Resistance State (HRS), representing a logical-0, or a Low Resistance State (LRS), representing a logical-1, by applying a voltage across terminals VS and BL and controlling the current through the CES using transistor 106.

For example, a bitcell may have a resistance of 10 MΩ in the HRS and 0.1 MΩ in the LRS.

When the bitcell is 'set', the cell resistance becomes low and may be chosen to represent a logical-1. The cell is set, for example, by applying a potential in excess of voltage VSET to terminal BL while VS is at 0V. The voltage at terminal WL is controlled to provide adequate current compliance.

When logic signal 110, denoted as nPROG[r], is asserted, the output from inverter 112 is de-asserted and the bitcell 102 is deselected. Thus, nPROG[r] is a 'program-disable' signal for row r.

When signal nPROG[r], is de-asserted, the output from inverter 112 is asserted and the bitcell 102 is selected or enabled for programming or reading.

In order to program the bitcell to a logical-1, i.e. 'set' the bitcell to logical 1, a voltage VSET is applied across the bitcell. Signal GSET on line 114 is passed through inverter 116 and opens transistor 118 to apply the voltage. At the same time, the inverted GSET signal (nGSET) opens transistor 120 to provide a reference voltage VLOW to inverter 112. Thus, when nPROG[r] is de-asserted and GSET is asserted, the voltage VLOW is supplied on word line WL[r]. This controls the current carrying capacity of transistor 106. In this way, both the current flow though the CES and the voltage across it are controlled by the programming signals VSET and VLOW, causing it to transition to a low resistance state (logical-1).

Similarly, when signal nRST[c] on line 122 is de-asserted, the bitcell is reset to logical-0. Transistor 124 is opened and a voltage VRST is applied across the terminals of bitcell 102. At the same time, signal GSET is de-asserted opening transistor 126 and causing a voltage VHIGH to be applied on the word line 108. The resulting combination of voltage and current, controlled by the programming signals VRST and VHIGH, causes the bitcell to reset, that is, to transition to the high resistance state (logical-0).

In one embodiment VSET≈1.2V and VRST≈0.6V. The cell is read by measuring its resistance, for example by applying a voltage VREAD≈0.25V across the cell. The transistor may be selected so that word line voltage VHIGH can be set at the reference voltage VDD, while voltage VLOW is set lower than VHIGH. VHIGH may be used for reading, for example.

Line 126 may be connected to all rows in a column c of the array, and will be referred to as the bit line for column c, denoted as BL[c].

Circuit 128 provides signals WL[r] in response to a 'global set' signal GSET and a 'program-disable' signal nPROG[r]. Other circuits with equivalent operational characteristics will be apparent to those skilled in the art.

Figure 2:
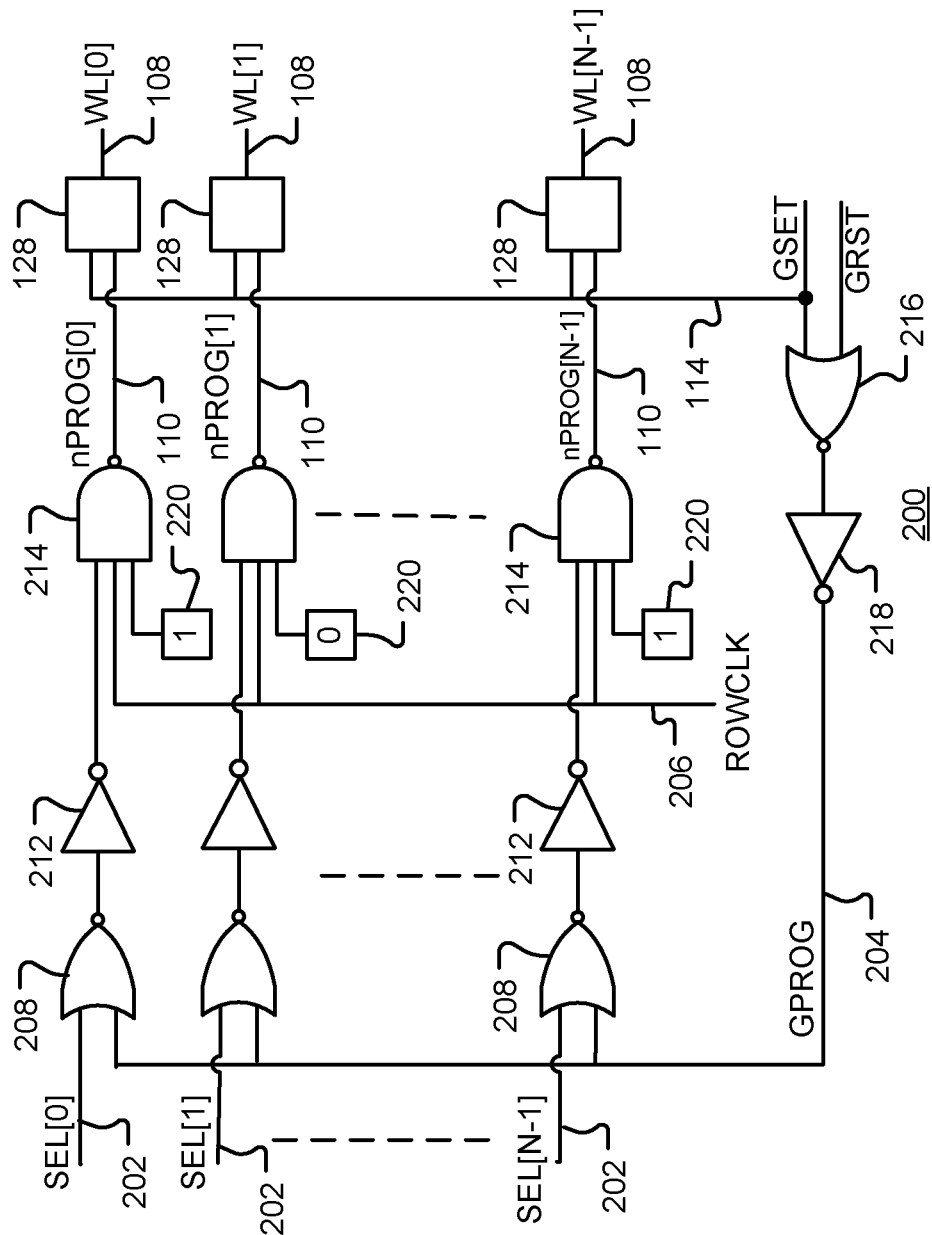
FIG. 2 shows a circuit for driving word lines of a CeRAM memory array, in accordance with embodiments of the disclosure.

FIG. 2, shows an example of a circuit 200 for driving word lines of a CeRAM array. The circuit may be used to set and reset bitcells of the array either individually or together. When a row clock (ROWCLK) signal on line 206 is asserted, word line WL[r] is driven if either a row select signal SEL[r] on line 202 or a global program signal GPROG on line 204 is asserted. In the example shown, each line of the logic circuit comprises NOR gate 208, inverter 212 and NAND gate 214. The resulting program-disable signal nPROG[r] is supplied to circuit 128 for each row.

Using NOR gate 216 and inverter 218, global program signal (GPROG) on line 204 is asserted when either a global set (GSET) or global reset (GRST) signal is asserted. The GSET signal is also provided to word line drive circuits 128 to enable selection of the appropriate word line voltage for the desired operation.

Masking registers 220 may be used to mask or unmask a word line. When the mask register is set to logical-1, the output from NAND gate 214 is unchanged. However, when the mask register is set to logical-0, the output from the NAND gate is always logical-1, so the word line is disabled.

Circuit 200 provides an ability to set and reset selected bitcells or groups of bitcells in a CeRAM array. In turn, this facilitates rapid testing and repair of the array.

Array testing is desirable, for example, because of the possibility of manufacturing defects in the bitcell or surrounding logic (e.g., bit-line, word-line, address decoder). These defects can render one or more bitcells unusable. Prior arrays testing uses either integrated Memory Built-In Self-Test (MBIST) circuit or an off-chip memory tester. Either method is time-consuming because each address location, that is, each row of the array must be tested in sequence.

Figure 3:
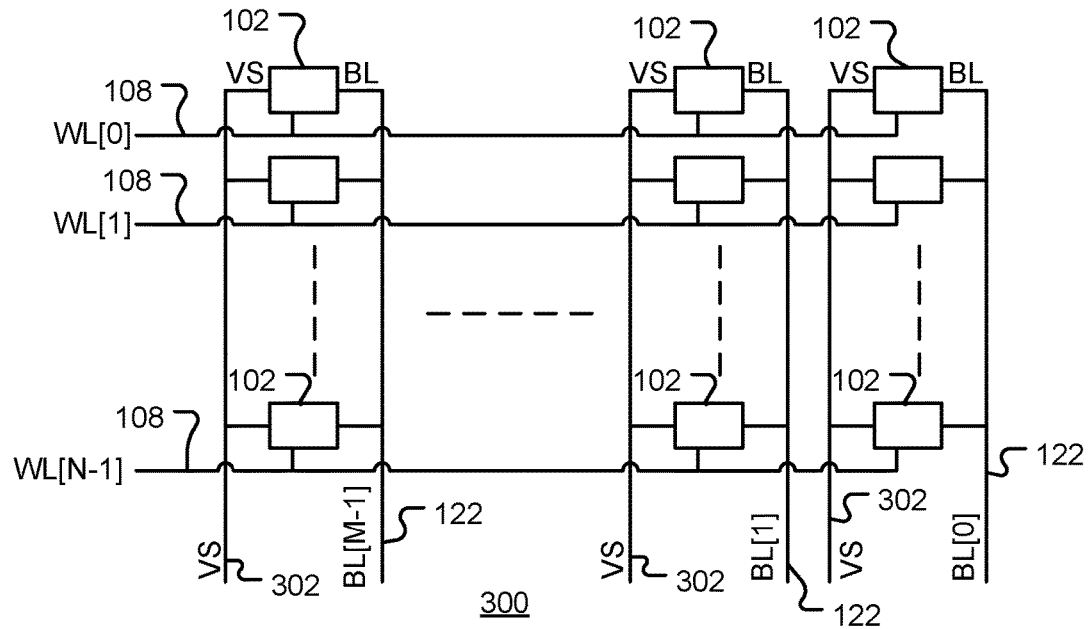
FIG. 3 is a diagram of an array of bitcells.

FIG. 3 is a diagram of an array 300 of bitcells 102. Word lines WL[r] 108 couple between bitcells 102 of each row r of the N rows, while bit lines BL[c] 122 couple between bitcells 102 of each column c of the M columns. In the embodiment shown, each row has a source line 302. A cell 102 can be programmed by controlling an associated word line and bit line.

Figure 4:
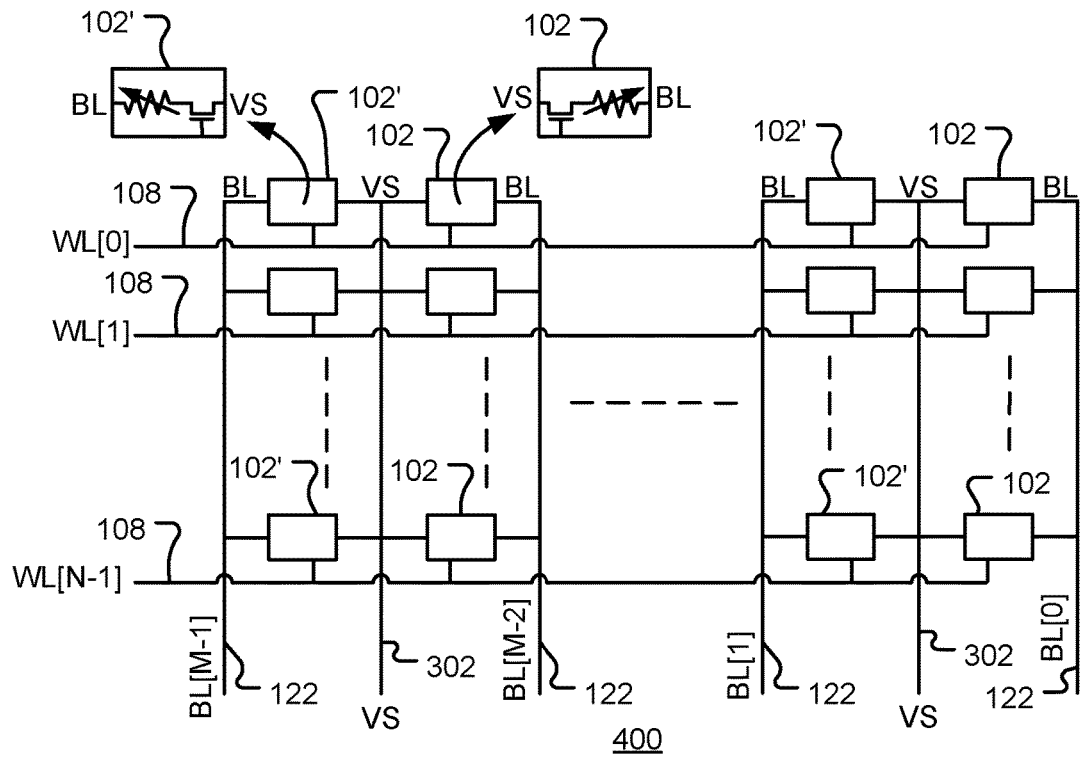
FIG. 4 is a diagram of a further array of bitcells, in accordance with embodiments of the disclosure.

FIG. 4 is a diagram of an alternative embodiment of an array 400, in which adjacent rows share a common source line 302, resulting in a simpler circuit. Again, word lines WL[r] 108 couple between bitcells 102 of each row r of the N rows, while bit lines BL[c] 122 couple between bitcells 102 of each column c of the M columns. Note that bitcells 102' are reversed compared to bitcells 102, so that the transistor is coupled to source lines 302 while the CES element is coupled to bit lines 122.

The present disclosure provides a faster way to detect one or more defective bitcells in an array. The array may be configured as shown in FIG. 3 or FIG. 4, or in other ways. Bitcells are tested by connecting them together in parallel or series to determine if any of the cells are not programmed into their expected state, either SET (logical-1) or RESET (logical-0). The approach uses the properties of resistive elements connected in series and in parallel.

Figure 5:
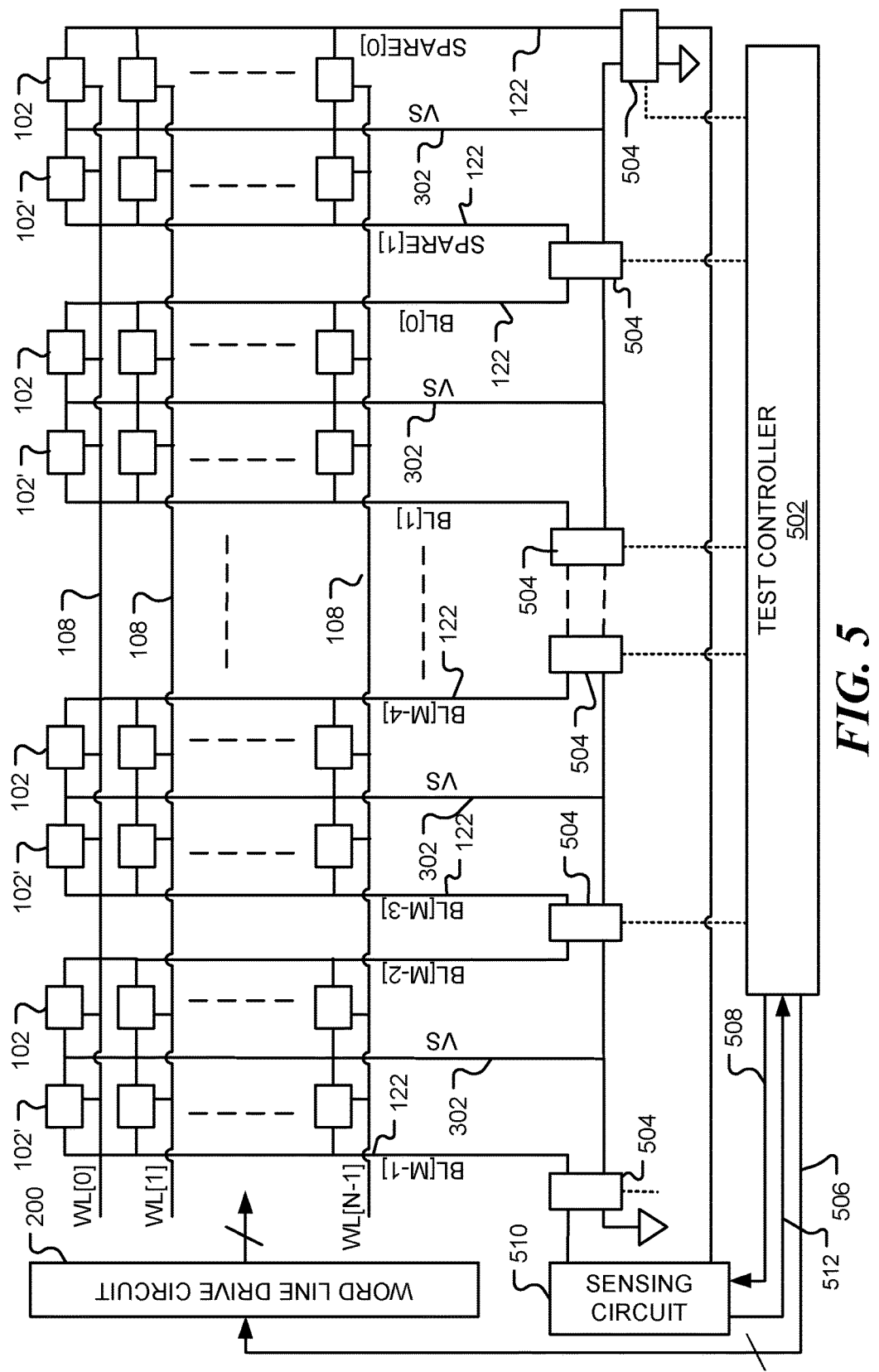
FIG. 5 shows a memory array with an integrated array test/repair circuit in accordance with embodiments of the disclosure.

FIG. 5 is an example of a bitcell array with an integrated array test/repair circuit for testing the array. Test controller 502 controls analog switches 504 of an interconnect circuit to select a test circuit through the array through which test signals may be routed. Each analog switch 504 is operable to couple a selected input to a selected output, as described below with reference to FIG. 6. Referring again to FIG. 5, the test signals are selectively coupled to bit lines 122 of the array. Word line control signals on line 506 are decoded by word line drive circuit 200 that, in response, drives selected one or more word lines 108 of the array. A signal on line 508 initiates measurement of the resistance of the test circuit by resistance sensing circuit 510. The measured resistance is compared to an expected resistance and a corresponding PASS/FAIL signal is passed back to test controller 502 on line 512.

Figure 6:
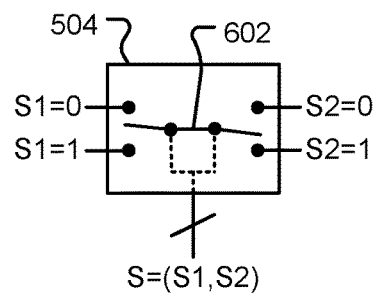
FIG. 6 is a diagram of an analog switch in accordance with embodiments of the disclosure.

FIG. 6 is a diagram of an analog switch 504, in accordance with embodiments of the disclosure. In the example shown, the switch 504 comprises two single pole double throw (SPDT) switches coupled back to back. The switch 504 is controlled by a 2-bit signal S having bits S1 and S2. In the example shown the bit S1 determines which of the two left terminals is coupled to central node 602, while the bit S2 determines which of the two right terminals is coupled to central node 602.

In one embodiment, the array is tested to identify cells that can't be programmed to logical-1 (LRS) and then reset logical-0 (HRS). First, a bulk set operation is performed. For example, this may be done by setting the voltage across all cells to VSET (for example VSET=1.2V) and driving all word-lines with a voltage VLOW. Then, with voltage across the cells set to VRST (for example, VRST=0.6V), all word-lines are driven by a voltage VHIGH to reset the cells to the high resistance state.

Figure 7:
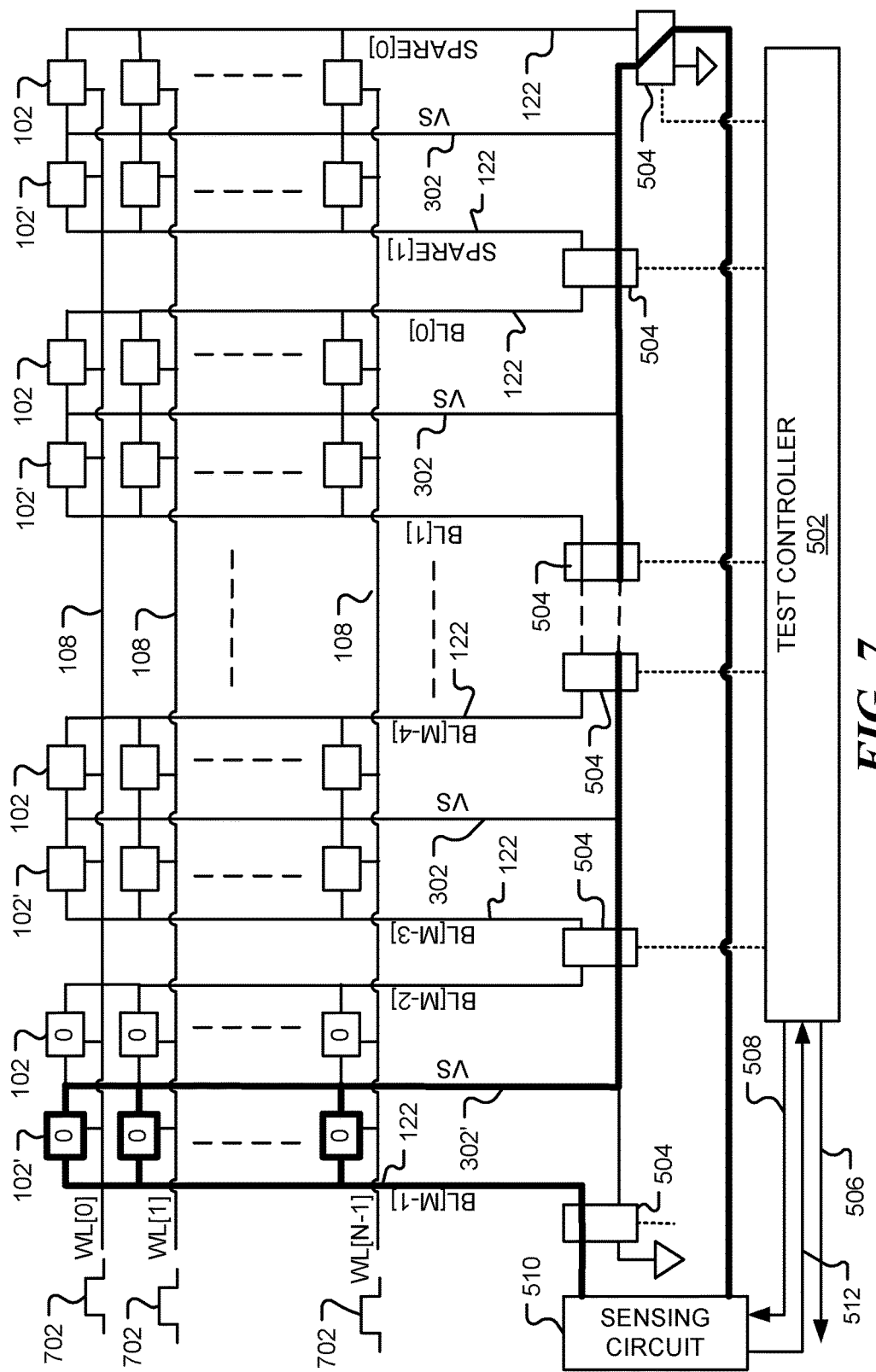
FIG. 7 is a diagram illustrating testing of a column of an array, in accordance with embodiments of the disclosure.

FIG. 7 is a diagram showing how a column of an array is tested to determine if any cells have not been reset to logical-0 (HRS). Switches 504 are controlled by test controller 502 such that the circuit indicated by the bold lines is formed. That is, the analog switches 504 of the interconnect circuit are controlled to couple bit line BL[M−1] and the associated source line 302' to resistance sensing circuit 510. All of the word lines 108 are fired, as indicated by signals 702, and resistance sensing circuit 510 is operated to measure the resistance of the test circuit indicated by the bold lines. The resistive elements of column of the N bitcells coupled to bit line BL[M−1] are coupled together in a parallel arrangement.

The total resistance $R_{total}$ of the N resistors in parallel satisfies:

$$\frac{1}{R_{total}} = \sum_{r=0}^{r=N-1} \frac{1}{R_r}, \quad (1)$$

where $R_r$ is the resistance of the cell in row r. All cells are expected to have a resistance corresponding to the HRS state, for example, $10^7 \Omega$. For example, for an array with 128 rows, the expected resistance would be $10^7/128 = 78$ kΩ.

Figure 8:
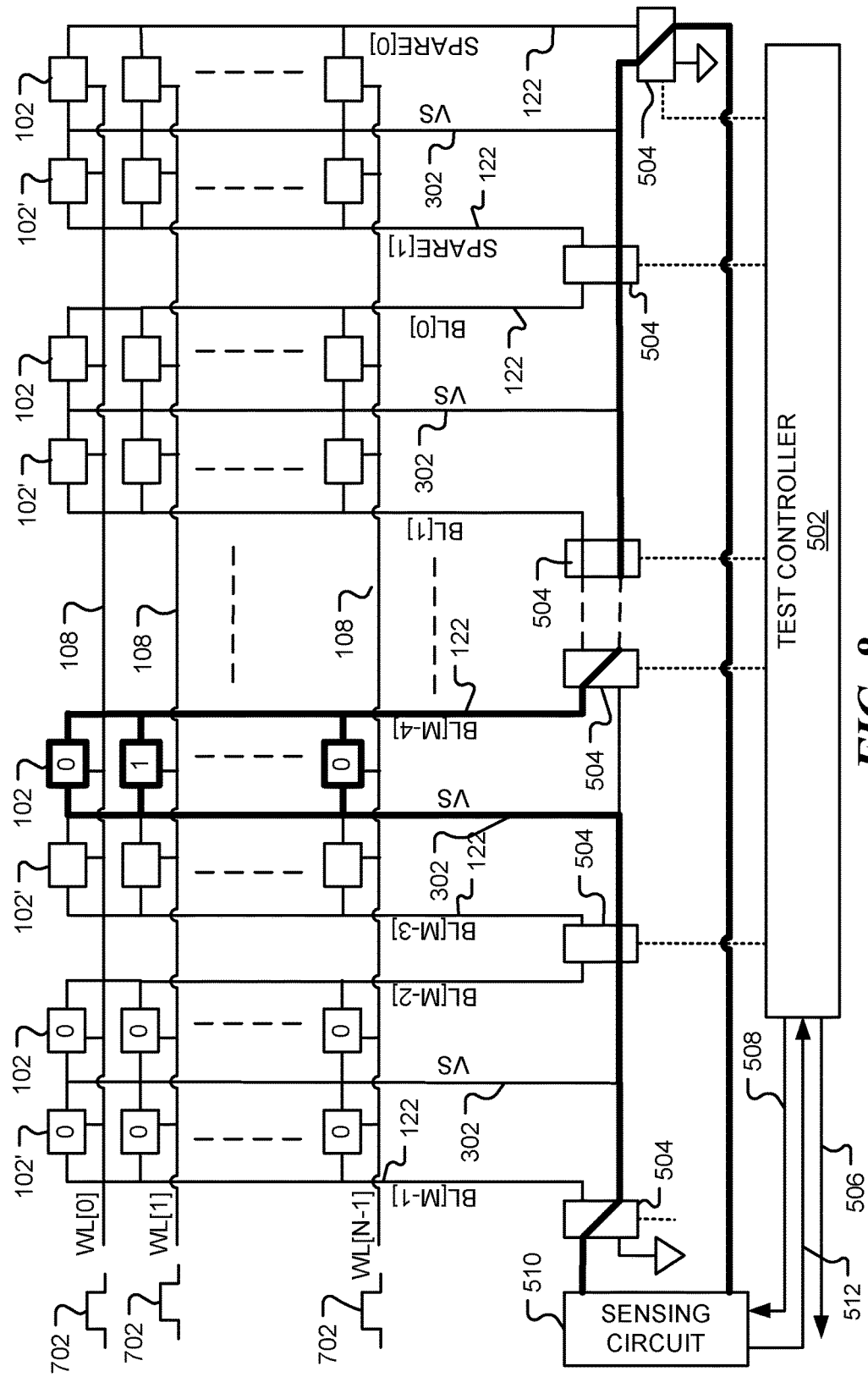
FIG. 8 is a diagram illustrating testing of another column of an array, in accordance with embodiments of the disclosure.

FIG. 8 shows an alternative configuration of the test circuit with the signal path shown in bold. In this configuration, the column of cells coupled to bit line BL[M−4] are connected in a parallel arrangement. In the example shown, the cell in row 1 (coupled to line WL[1]), is defective and has remained in a Low Resistance State, (LRS) corresponding to logical-1. The measured resistance will be $1/(127/10^7+1/10^5)=44$ kΩ. Similarly, if two cells were in the LRS, the resistance would be 31 kΩ. Thus, even the presence of a single defective cell causes a significant change in the resistance of the tested circuit. Resistance sensing circuit 510 is configured to detect this deviation from the expected resistance and thereby distinguish between fault-free and faulty columns of an array. In one embodiment, for example, the resistance testing circuit uses one or more reference resistors fabricated such that their resistance is less variable than that of a CeRAM bitcell. Further, a resistance testing circuit may be tunable, using reference resistors fabricated such that their variation is minimal compared to the variation of CeRAM HRS/LRS resistance values.

When a faulty column of cells is detected, the row may be detected by firing only a subset of the word lines. For example, each row may be activated in turn or deactivated in turn. This may be done by configuring the word line signal on line 506 or by using masking registers on the word lines, such as element 220 in FIG. 2 for example. In a further embodiment, a binary search, or other iterative search, may be made to identify the one or more defective cells.

When a defective cell is found during a search, the corresponding row may be eliminated from testing and the bulk test repeated for the remainder of the column. Thus, all defective cells in a column may be discovered without testing each individual cell.

In this manner defective bitcells that cannot be reset to the HRS may be detected.

In a similar manner, an array can be tested for one or more bitcells that can't be programmed to the Low Resistance State by connecting bitcells in series.

Figure 9:
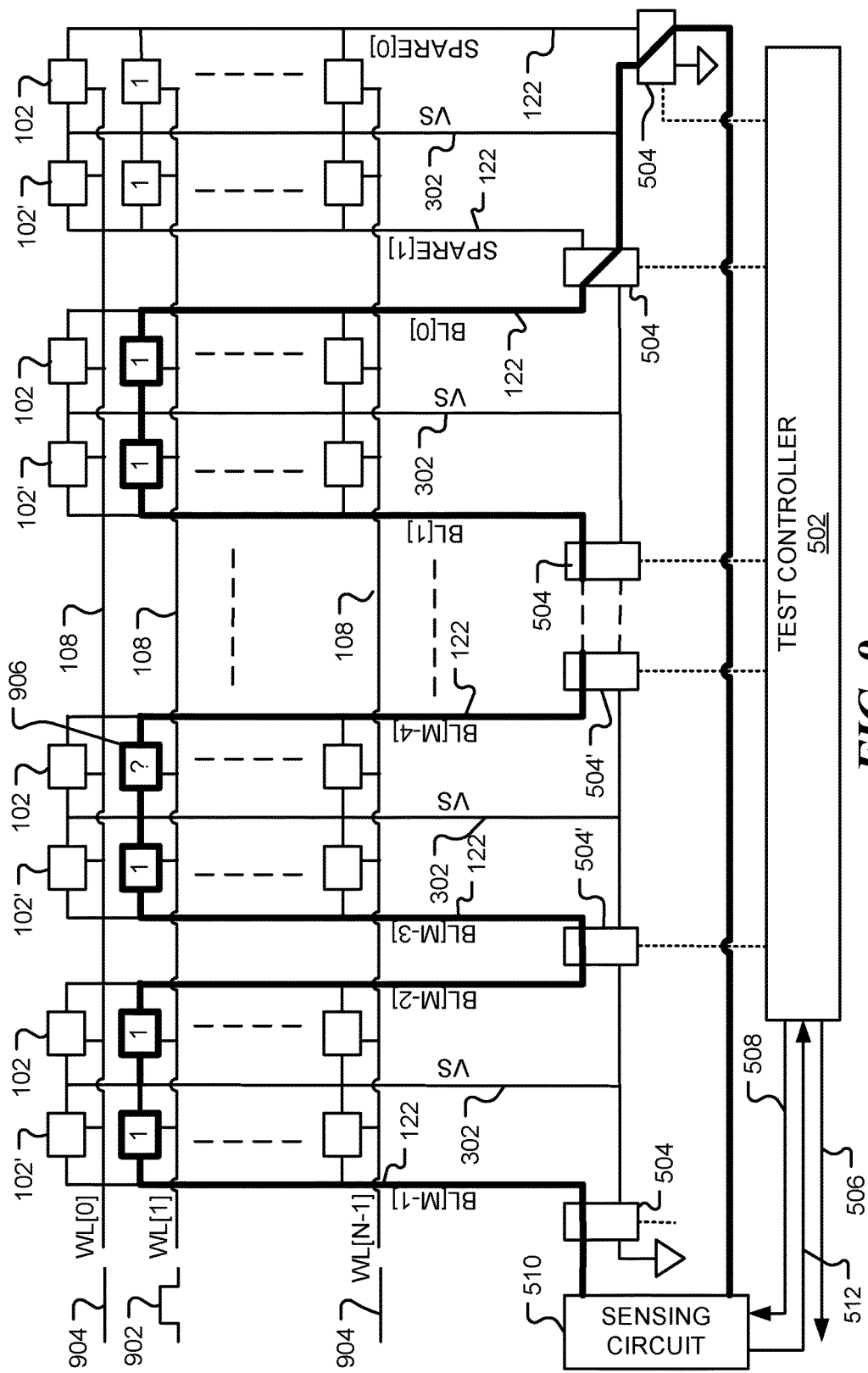
FIG. 9 is a diagram illustrating testing of a row of an array, in accordance with embodiments of the disclosure.

FIG. 9 shows an array configured for testing a row of an array. Switches 504 are configured to couple adjacent bit lines 122, while the VS lines 302 are tri-stated. A single word line 108 (WL[1] in the example) is fired as indicated by signal 902, while bitcells in the other rows are deselected as indicated by signals 904. The total resistance measured across M columns is $$R_{total} = \sum_{c=0}^{M-1} R_c \quad (2)$$

In an array with 64 columns, for example, the total expected resistance is $64 \times 10^5 \Omega = 6.4$ MΩ. When a single cell is defective and remains in a high resistance state, the total measured resistance will be $63 \times 10^5 \Omega + 10^7 \Omega = 16.3$ MΩ. Thus, the difference between the expected and measured resistance is significant and may be detected by the resistance sensing circuit 510. The difference in resistance may be compared to a threshold value, for example.

Referring again to FIG. 9, when bitcell 906 has the value 1, the measured resistance of the test circuit shown in bold will be 6.3 MΩ. However, when bitcell 906 has the faulty value 0, the measured resistance will be 16.4 MΩ.

A memory array may be constructed to have a set of spare rows and/or columns that can be substituted for faulty rows/columns. The array shown in FIG. 9 has two spare columns, for example, linked to bit lines denoted as SPARE [0] and SPARE[1]. The integrated test controller 502 may be configured to find the locations of faulty cells and to replace the cells with spare cells. For example, analog switches 504 in the interconnect circuit may be configured to replace each pair of columns in turn with the pair of spare columns, until the measured resistance matches the expected resistance.

Figure 10:
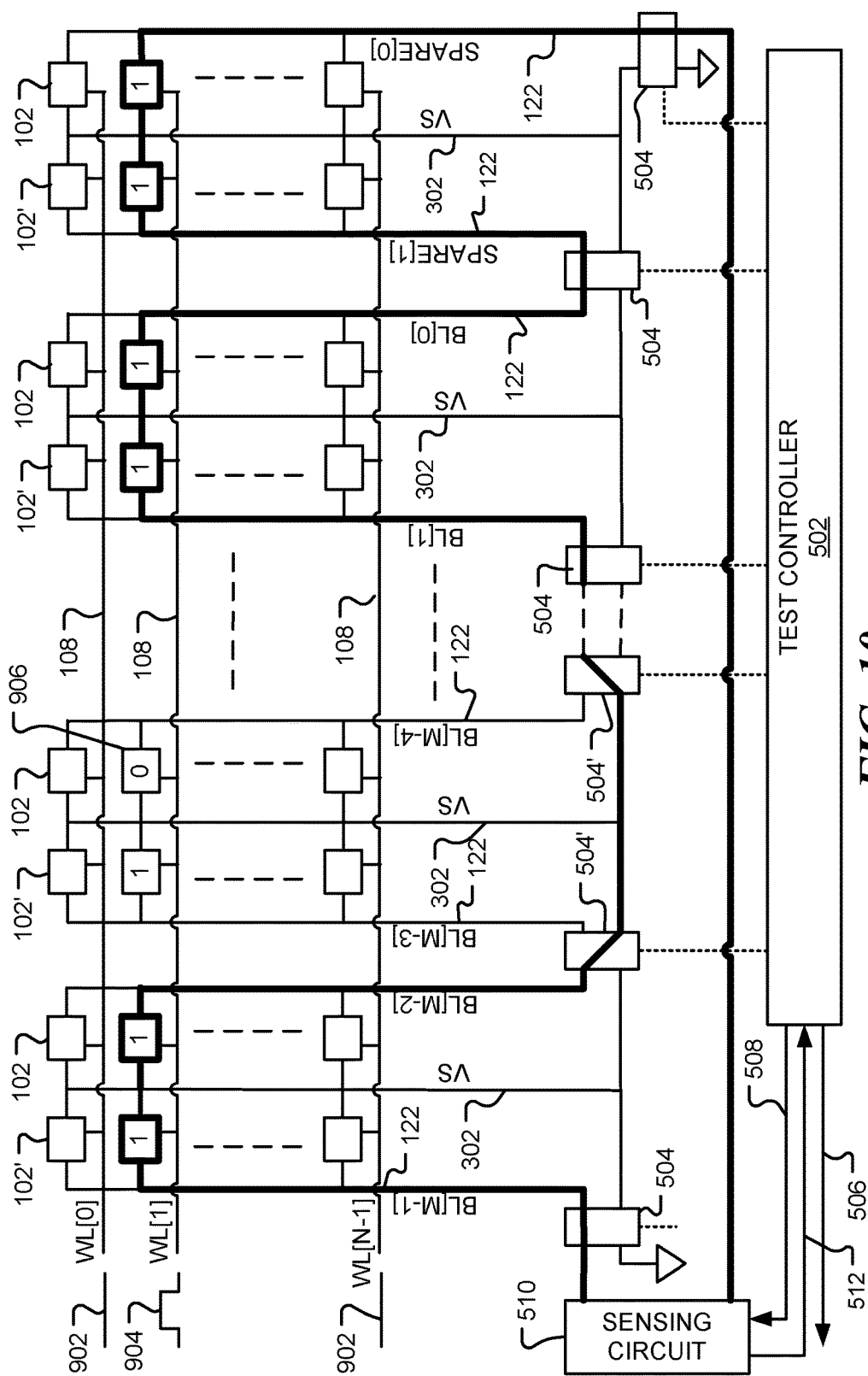
FIG. 10 is a diagram illustrating further testing of a row of an array, in accordance with embodiments of the disclosure.

FIG. 10 shows an array in which the test circuit, shown in bold, bypasses the column with defective bitcell 906 and instead is routed to the pair of spare columns. For this test circuit, the measured resistance will match the expected resistance. A similar test may be performed without the use of a spare column, but the expected resistance will be slightly different (6.3 MΩ v's 6.4 MΩ in the example above). In general, the test can be run with or without one or more spare columns, provided that the number of cells included in the series connection is known. For an array having 32 bits per word, and thus 32 columns, the exclusion of 2 of the 32 columns would only result in approximately 6% difference in total resistance. Likewise, for 64 columns, excluding two columns during test would only result in approximately 3% total resistivity difference. Alternatively, if spare columns are enabled, as shown in FIG. 10, the resistivity with faulty bits excluded should match the expected resistivity.

In this manner a defective pair of bitcells, at least one of which cannot be set to the LRS, may be detected.

Thus, by configuring the test circuit to couple the bitcells in series or parallel arrangements and selecting which word lines are fired, a defective bitcell or pair of bitcells can be detected and its location determined.

A defective cell may be replaced by replacing the row or column (or pair of columns) in which it is located using a spare row or column.

Alternatively the device containing the array may be marked as failing.

Figure 11:
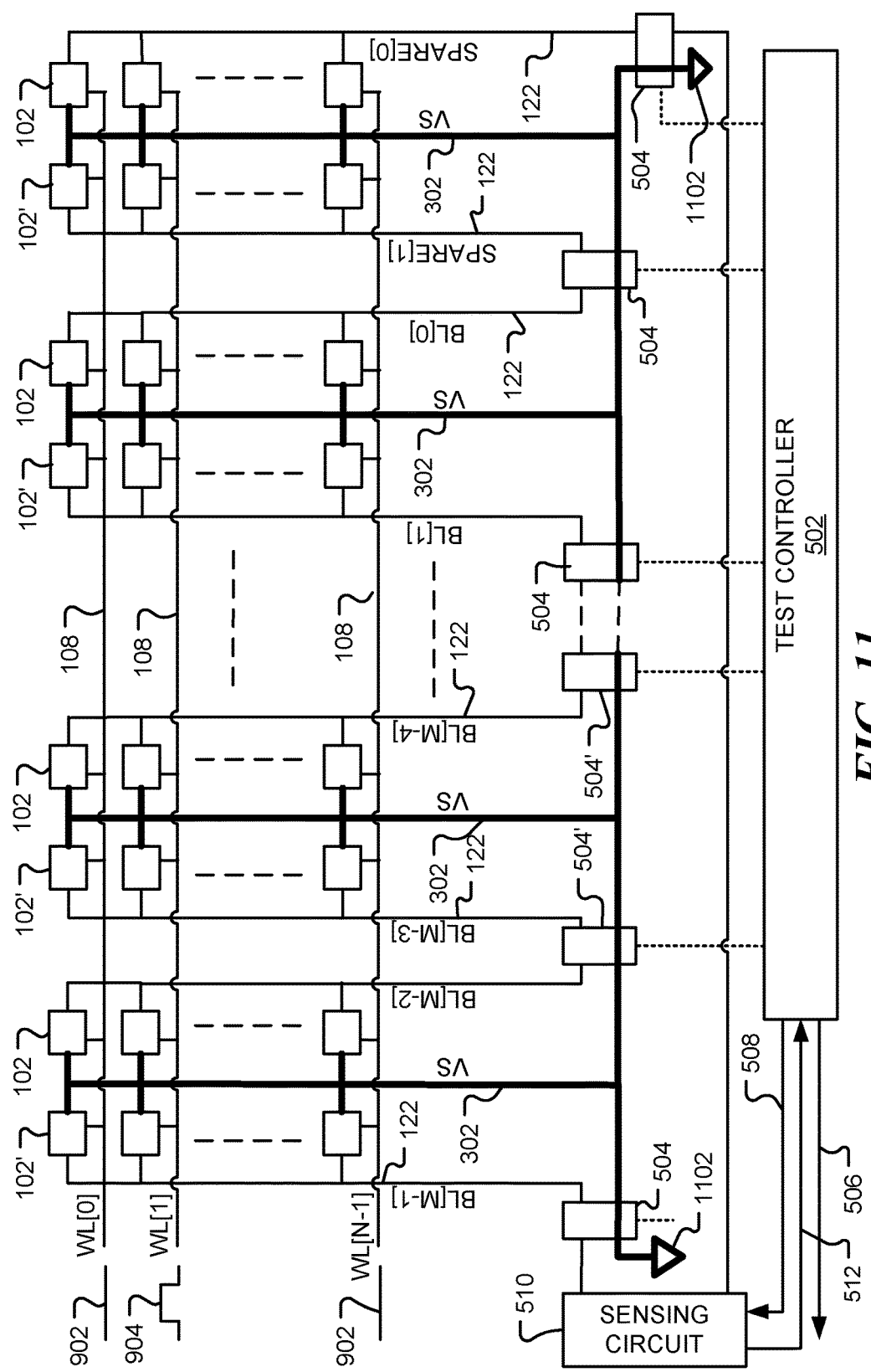
FIG. 11 shows a memory array test circuit configured for normal operating, in accordance with embodiments of the disclosure.

FIG. 11 shows the test circuit configured for normal operating. Analog switches 504 of the interconnect circuit are configured to couple all of the VS 302 lines to ground 1102 as indicated by the bold lines.

The above described circuits and methods may be used in conjunction with other array test methods to test for other failure mechanisms. For example, when all cells are set or reset simultaneously, read/write faults such as when programming a cell to LRS causes its neighbor cell(s) to flip from LRS/HRS, or vice versa, are not evidenced.

The number of cells that can be connected, either in parallel or in series, may be limited by the sensitivity of the resistance sensing circuit. In the first example given above, 128 bits in parallel resulted in an easily-detectable total resistance value. However, testing 1024 bits in parallel requires greater sensitivity. Thus, in some embodiments, sub-arrays may by tested, either sequentially or simultaneously.

While an array may be tested without the capability to set or reset all cells in the array simultaneously, the total time required for testing is much less if capability exists.

FIG. 2, discussed above, shows an example of a circuit for which a global set signal GSET or a global reset GRST signal can control all of the word lines, WL[0] . . . WL[N−1].

The test methods disclosed above may be useful, for example, when a quick check of an array (or a sub-array thereof) is needed, or in applications where memory built-in self-test (BIST) is unavailable. Even if memory BIST is available, the disclosed methods can reduce the amount of time required to find all hard failures (i.e., cells that can't be set and/or reset), and replacing them with spare rows or columns. For example, the disclosed methods have in application an automotive device, in which a full BIST test of the array would run longer than the cycles dedicated to test. Instead, the bulk resistance tests can be run, quickly checking for defects and repairing them or triggering some other action, such as flagging the memory location(s) as in need of repair/replacement.

It will be apparent to those of ordinary skill in the art that the logic circuits may be constructed using various combinations of logic elements and utilizing positive or negative logic or a combination thereof.

In accordance with some embodiments, the memory comprises an array of bitcells that include a Correlated Electron Switch (CES). A CES cell uses a material, such as a transition metal oxide (TMO), which exhibits an abrupt state transition from low resistance to high resistance. The TMO may be Nickel Oxide (NiO), for example. In contrast to other resistive memory devices, the state transition arises from electron correlations in the material, rather than from any solid state structural phase change. The transition may be controlled by a voltage and current applied across the material, as discussed above.

In the high resistance state, CES may have a resistance or the order of 10 MΩ, for example. In the low resistance state, CES may have a resistance or the order of 100KΩ, for example. The capacitance also exhibits a transition from high to low, so a CES may be considered to be a variable impeder having both resistance and capacitance.

A CES is born in a low resistance state, that is, the doping of the transition-metal oxide (TMO) creates both electrons and holes. However, the doping is still p-type (defined by moving the Fermi level down in energy). The electrons are well screened in that there is no band-splitting, but are well above this new Fermi level. Therefore, the electrons do not contribute to transport. In the initial state, there is a large surplus of electrons in the correlated electron material which do not contribute to current. When bias is applied, hole injection occurs causing a hole current. When sufficient bias is applied (greater than the band-splitting potential) a Mott transition occurs. The transition occurs when the number of injected holes equals the number of electrons trapped in the system. The material in the CES changes from a metal state to the insulator state via the Mott transition. At this point, the electrons are no longer screened and become localized, this correlation splits the bands causing the material to have a very high resistance. In this state, transport is still via holes. If enough bias is applied, electrons are injected. When enough electrons have been injected and enough potential is applied to overcome the set potential criteria, the increase in electrons screens the electrons and removes the localization—collapsing the band-splitting potential and forming a metal or low resistance material. The electrons injection into the system is controlled by the compliance of the system. The compliance therefore sets the number of electrons in the system that need to be "captured" by holes for the Mott transition to occur.

Correlated electron materials may be used in memory devices and switches. The resistance state of a CES may be used to designate a stored data value, which may be read in a variety of ways. Data may be written to a CES-based memory device using a variety of methods, examples of which are described in co-owned U.S. patent application Ser. No. 14/826,064 Programmable Voltage For Correlated Electron Switch and/or co-owned U.S. patent application Ser. No. 14/826,091 Programmable Current For Correlated Electron Switch which are incorporated herein by reference.

State transitions in the material only occur when both voltage and current levels exceed certain thresholds. When the current threshold is not exceeded, the material, once placed into a high resistance state, remains in a high resistance state, even when subject to a high voltage electrostatic discharge, for example.

Figure 12:
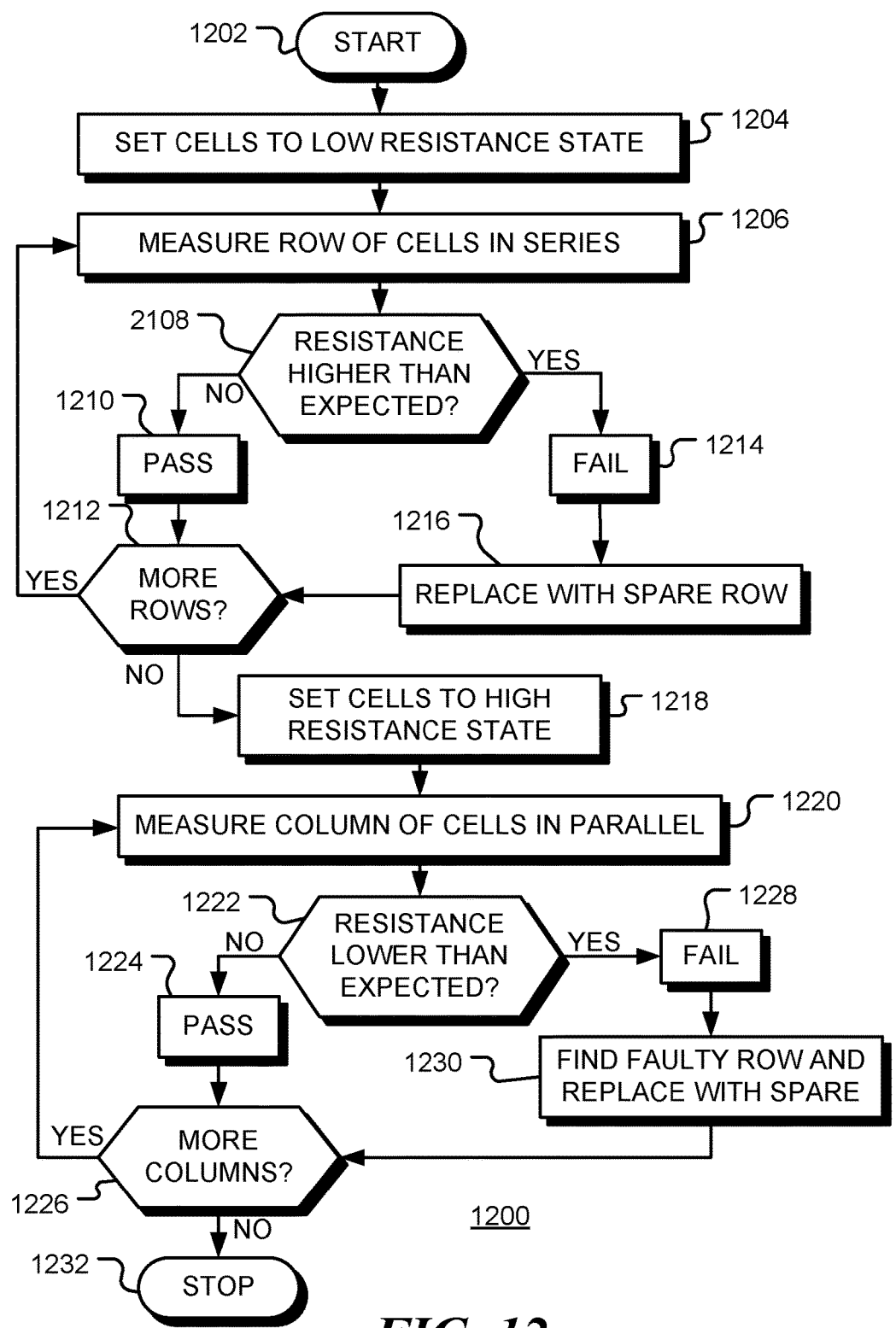
FIG. 12 is a flow chart of a method for array testing, in accordance with embodiments of the disclosure.

FIG. 12 is a flow chart 1200 of a method for array testing in accordance with embodiments of the disclosure. Following start block 1202, an attempt is made to set all cells in the array to a low resistance state (or switched from a high resistance state to a low resistance state) at block 1204. This may be done by asserting a global set signal. At block 1206, the electrical resistance of a row of cells in the array is measured. The cells in the row are connected in a series arrangement using an interconnect circuit The interconnect circuit may comprise, for example, a set of analog switches that couple bit lines and source lines between columns of the array. If the measured resistance approximates that expected for a row of cells in a low resistance state, as depicted by the negative branch from decision block 1208, the row is deemed to have passed the test at block 1210 and a pass signal may be generated. Flow then continues to block 1212. If the measured resistance is higher than that expected for a row of cells in a low resistance state, as depicted by the positive branch from decision block 1208, the row is deemed to have failed the test at block 1214 and a fail signal may be generated. Optionally, the failed row may be replaced with a spare row at block 1216. If more rows are to be tested, as depicted by the positive branch from decision block 1212, flow returns to block 1206 to measure the next row. Otherwise flow continues to block 1218.

At block 1218, an attempt is made to reset all the cells in the array to a high resistance state (or switched from a low resistance state to a high resistance state). This may be done by asserting a global reset signal, as described above. At block 1220, the electrical resistance of a column of cells in the array is measured. The cells in the column are connected in a parallel arrangement using the interconnect circuit. If the measured resistance approximates that expected for a column of cells in a high resistance state, as depicted by the negative branch from decision block 1222, the column is deemed to have passed the test at block 1224 and a pass signal may be generated. Flow continues to block 1226. If the measured resistance is lower than that expected for a column of cells in a high resistance state, as depicted by the positive branch from decision block 1222, the column is deemed to have failed the test at block 1228 and a fail signal may be generated. At block 1230, the column of cells is tested further by enabling or disabling rows to identify the failed row and the failed row is replaced with a spare row at block 1232. If more columns are to be tested, as depicted by the positive branch from decision block 1226, flow returns to block 1220 to measure the next column. Otherwise, the method terminates at block 1232.

It will be apparent to those of ordinary skill in the art, that rows and columns may be tested in any order. For example, columns could be tested first. It should also be apparent that the roles of columns and rows may be reversed, with spare columns used to replace columns containing one or more defective cells.

Figure 13:
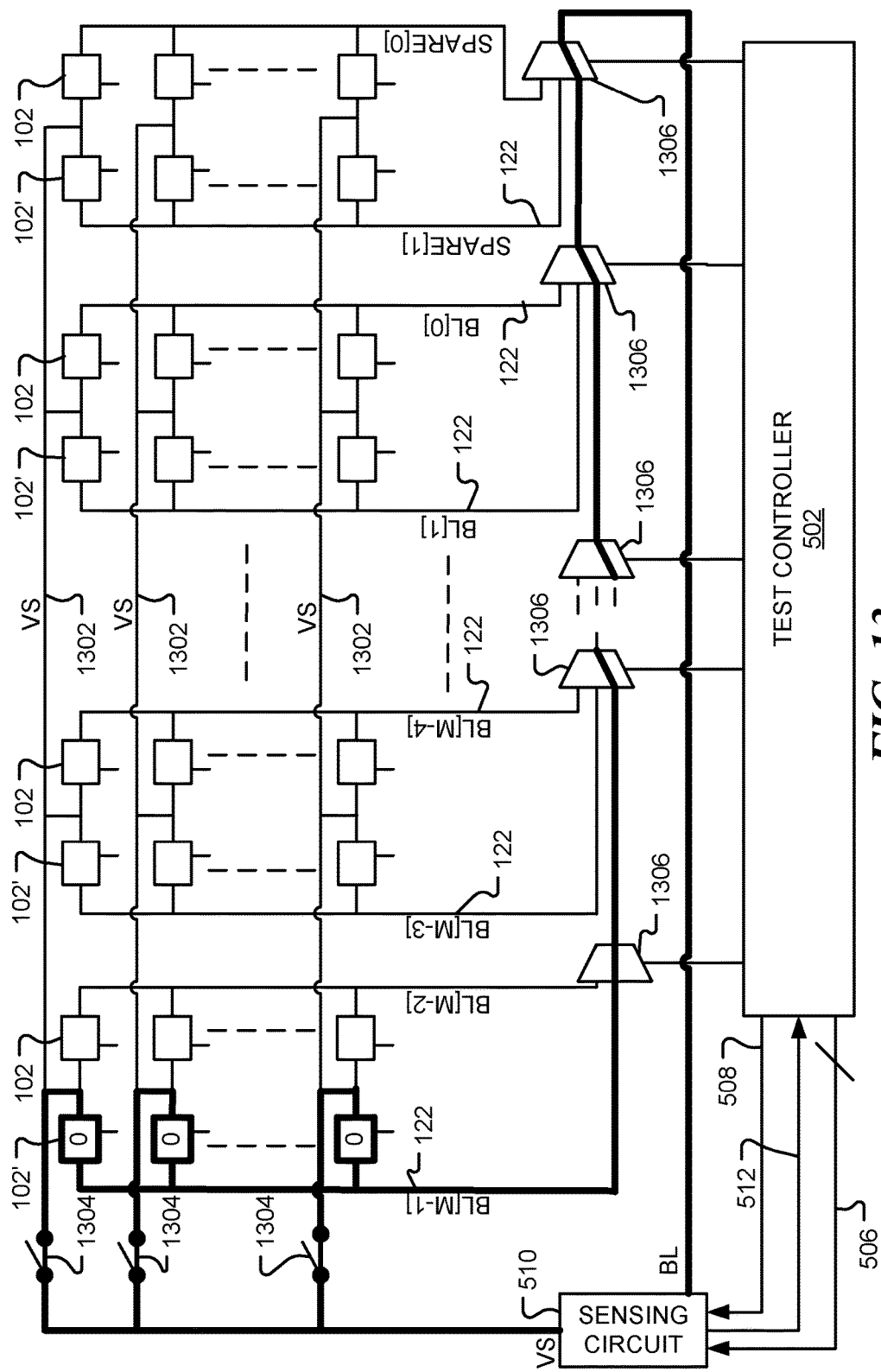
FIG. 13 is a diagram illustrating testing of a column of an array, in accordance with embodiments of the disclosure.

It will also be apparent to those of ordinary skill in the art that the interconnect circuit for selecting rows or columns of the array may take many forms. For example, FIG. 13 is a diagram illustrating testing of a column of an array, in accordance with embodiments of the disclosure, in which the VS terminals of bitcells are coupled across rows as opposed to columns (as described above). Each VS line 1302 is coupled to the sensing circuit 510 via a switch 1304. Columns of the array are selected for testing by configuring the analog multiplexers 1306. In the example shown, the analog multiplexers 1306 are controlled to enable test of the leftmost column of cells, as depicted by the signal path shown in bold. The cells are programmed to a HRS (logical-0) and are coupled in parallel. Any bitcells not set to the HRS will cause the measured parallel resistance to be lower than the expected resistance, indicating one or more defective cells.

Figure 14:
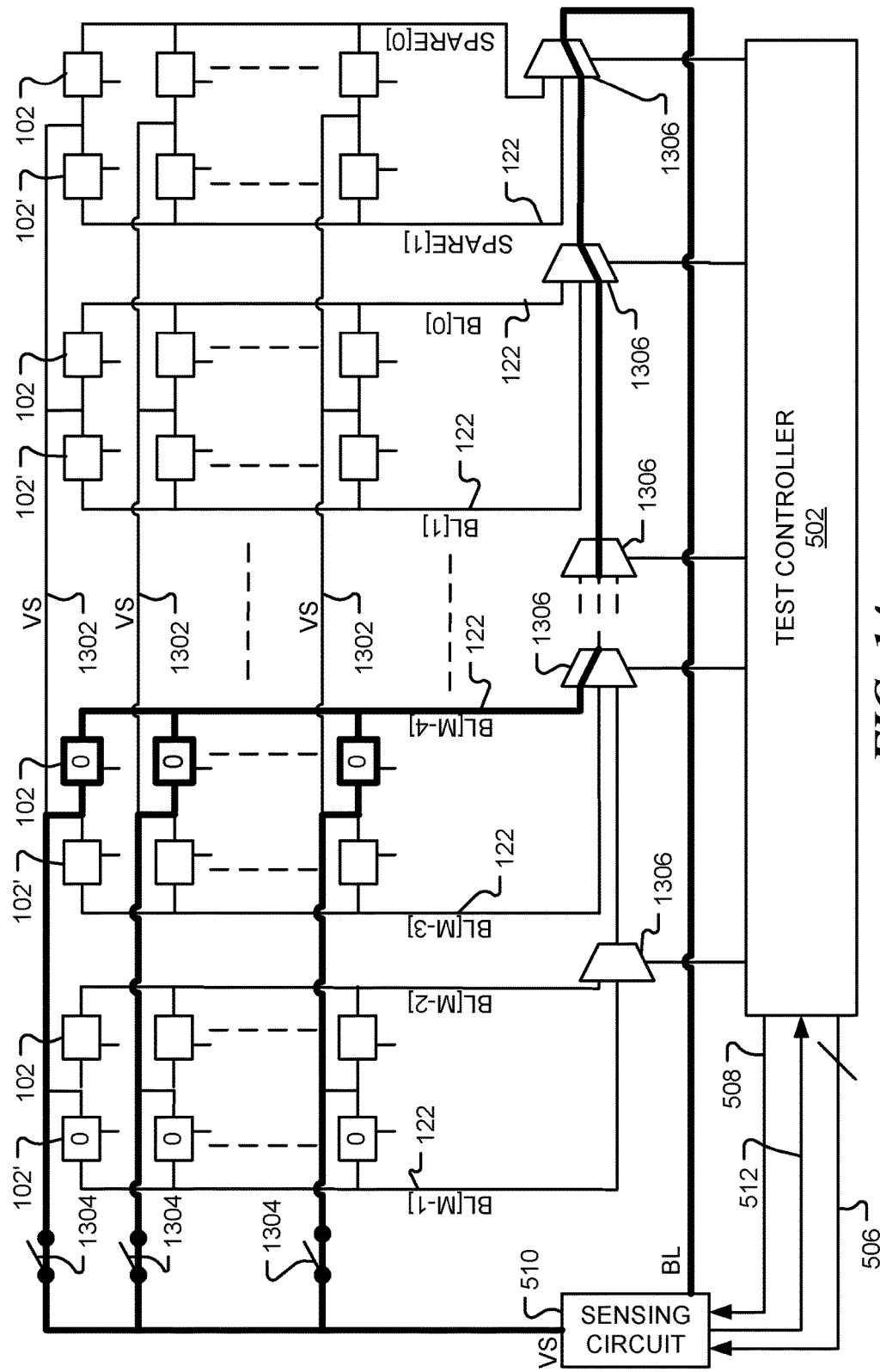
FIG. 14 is a diagram illustrating testing of a further column of an array, in accordance with embodiments of the disclosure.

FIG. 14 is a diagram illustrating testing of a further column of an array, in accordance with embodiments of the disclosure. In this example, the analog multiplexers 1306 are controlled to enable test of the column of cells coupled to bit line BL[M−4].

Figure 15:
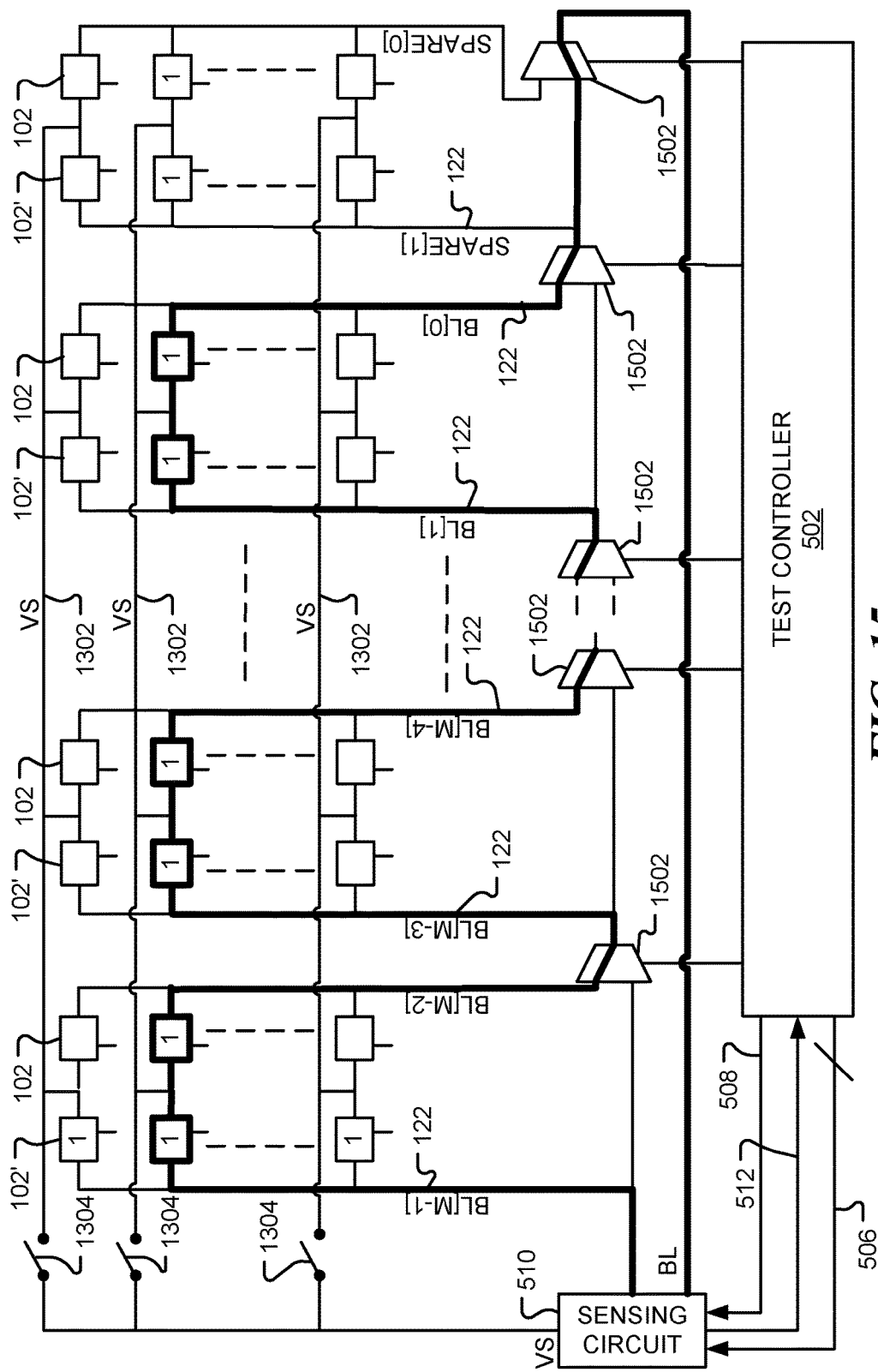
FIG. 15 is a diagram illustrating testing of a row of an array, in accordance with embodiments of the disclosure.

FIG. 15 is a diagram illustrating testing of a row of an array, in accordance with embodiments of the disclosure. In this example, lines 1302 again coupled the VS terminals of the bitcells across columns of the array. Switches 1304 are opened so that the VS terminals are tri-stated, and analog multiplexers 1502 are controlled to couple a row of bitcells in series for testing. In the example shown, the interconnect circuit is configured for testing the second row of bitcells. The bitcells are programmed to the LRS (logical-1). If any bitcell is not in the LRS, the measured series resistance of the rows will be greater than expected, indicating one or more defective cells.

The integrated circuits disclosed above may be defined be a set of instructions of a Hardware Description Language (HDL). The instructions may be stored in a non-transient computer readable medium. The instructions may be distributed via the computer readable medium or via other means such as a wired or wireless network. The instructions may be used to control manufacture or design of the integrated circuit, and may be combined with other instructions.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So for example performing X includes any suitable method for causing another party such as a remote user, a remote processing resource (e.g., a server or cloud computer) or a machine to perform X. Similarly, performing elements X, Y, and Z may include any method of directing or controlling any combination of such other individuals or resources to perform element X, Y, and Z to obtain the benefit of such steps. Thus method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

Accordingly, some features of the disclosed embodiments are set out in the following numbered items:

1. An apparatus for testing a plurality of storage elements, a storage element of the plurality of storage elements being variable between a first impedance state and a second impedance state, the apparatus comprising:
  an interconnect circuit operable to couple the plurality of storage elements in at least a first arrangement, the coupled plurality of storage elements in the first arrangement having a first expected impedance;
  an impedance sensing circuit operable to measure at least a resistive component of an impedance of the coupled plurality of storage elements; and
  a test controller operable to configure the interconnect circuit to couple the plurality of storage elements in the first arrangement and initiate measurement, by the impedance sensing circuit, of at least a resistive component of an impedance of the coupled plurality of storage elements in the first arrangement to provide a first measured impedance;
where the impedance sensing circuit is further operable to compare the first measured impedance with at least a resistive component of the first expected impedance.

2. The apparatus of item 1, where the plurality of storage elements comprises a plurality of bitcells of a memory array.

3. The apparatus of item 2, further comprising the memory array.

4. The apparatus of item 2, further comprising a circuit configured to program bitcells of the memory array to a selected impedance state of the first and second impedance states in response to a global set signal or a global reset signal.

5. The apparatus of item 2, where the memory array comprises a resistive random access memory (RRAM).

6. The apparatus of item 2, where the memory array comprises an correlated electron random access memory (CeRAM).

7. The apparatus of item 2, where the memory array further comprises one or more spare columns of bitcells, and where the interconnect circuit is further operable to couple to bitcells of the one or more spare columns.

8. The integrated circuit of item 2, where the test controller is further operable to control a plurality of word lines of the memory array to enable selection or deselection of one or more rows of bitcells of the array.

9. The apparatus of item 1, where a storage element of the plurality of storage elements comprises a correlated electron switch (CES).

10. The apparatus of item 1, where the first arrangement comprises a parallel arrangement of storage elements and where the plurality of storage elements in the parallel arrangement are programmed to an expected high impedance state.

11. The apparatus of item 1, where the first arrangement comprises a series arrangement of storage elements and where the plurality of storage elements in the series arrangement are programmed to an expected low impedance state.

12. The apparatus of item 1, where the interconnect circuit comprises a plurality of analog switches.

13. The apparatus of item 1, where the impedance sensing circuit is operable to measure the resistive component and a reactive component of the coupled plurality of storage elements.

14. The apparatus of item 1, where the impedance sensing circuit comprises one or more reference resistors.

15. A non-transient computer readable medium containing instructions of a hardware description language representative of the integrated circuit of item 1.

16. A method for testing a plurality of storage elements, a storage element of the plurality of storage elements comprising a variable impedance element designed to be set to a first impedance state by application of first programming signals and designed to be reset to a second impedance state by application of second programming signals, the method comprising:
  applying first programming signals to the plurality of storage elements;
  coupling at least some of the plurality of storage elements in a first arrangement, the first arrangement having a first expected impedance;
  measuring at least a resistive component of an impedance of the first arrangement of coupled storage elements to provide a first measured impedance;
  comparing the first measured impedance to the first expected impedance; and
  determining one or more storage elements of the plurality of storage elements to be failed dependent upon a difference between the first measured impedance and at least a resistive component of the first expected impedance.

17. The method of item 16, where the first measured impedance and the first expected impedance comprise resistance values and capacitance values.

18. The method of item 16, further comprising:
  applying second programming signals to the plurality of storage elements;
  coupling at least some of the plurality of storage elements in a second arrangement, the second arrangement having a second expected impedance;
  measuring at least a resistive component of an impedance of the second arrangement of coupled storage elements to provide a second measured impedance;
  comparing the second measured impedance to at least a resistive component of the second expected impedance; and
  determining one or more storage elements of the plurality of storage elements to be failed dependent upon a difference between the second measured impedance and the at least the resistive component of the second expected impedance.

19. A method for testing an array of storage elements, a storage element of the array comprising a variable impedance element designed to be set to a first impedance state by application of first programming signals and designed to be reset to a second impedance state by application of second programming signals, the method comprising:
  testing a row of storage elements of the array by:
  applying first programming signals to at least the row of storage elements in the array;
  coupling the row of storage elements in a series arrangement, the series arrangement having a first expected impedance;
  measuring a resistive component of an impedance of the series arrangement;
  comparing the first measured impedance to a resistive component of the expected impedance of the series arrangement; and
  determining the row of storage elements to be failed dependent upon a difference between the measured impedance of the resistive component of the series arrangement and the first expected impedance; and
  testing a column of storage elements of the array by:
  applying second programming signals to at least a column of storage elements in the array;
  coupling the column of storage elements in a parallel arrangement, the parallel arrangement having a second expected impedance;

measuring a resistive component of an impedance of the parallel arrangement;

comparing the measured resistive component of the impedance of the parallel arrangement to a resistive component of the second expected impedance; and determining the column of storage elements to be failed if a difference between the measured resistive component of the impedance of the parallel arrangement and the resistive component of the second expected impedance.

20. The method of item 19, further comprising, when the row of storage elements is determined to be failed:

for one or more iterations:

bypassing one or more storage elements in the row of storage elements;

retesting the row of storage elements; and determining a storage element of the one or more bypassed storage elements in the row of storage elements to be failed if the retested row is not determined to be failed.

21. The method of item 19, further comprising, when the column of storage elements is determined to be failed:

for one or more iterations:

controlling word lines of the memory array to deselect one or more storage elements in the column of storage elements;

retesting the column of storage elements; and determining a storage element of the one or more deselected storage elements in the column of storage elements to be failed if the retested column is not determined to be failed.

22. The method of item 19, where coupling the row of storage elements in the series arrangement or coupling the column of storage elements in the parallel arrangement comprises configuring one or more switches of an interconnect circuit.

23. The method of item 19, where the first programming signals and the second programming signals are applied simultaneously to all storage elements in the array.

24. The method of item 19, further comprising replacing a row or column of the array containing a storage element determined to the failed with a spare row or column.

What is claimed is:

1. An apparatus for testing an array of storage elements, a storage element of the array of storage elements being variable between a first impedance state and a second impedance state, the apparatus comprising:

an interconnect circuit operable to couple a row of the array of storage elements in series arrangement for row testing, the series arrangement having a first expected impedance, and further operable to couple a column of the array of storage elements in a parallel arrangement for column testing, the parallel arrangement having a second expected impedance;

an impedance sensing circuit operable to measure at least a resistive component of an impedance of storage elements coupled by the interconnect circuit; and a test controller operable to configure the interconnect circuit to couple the row of storage elements in the series arrangement and initiate measurement, by the impedance sensing circuit, of at least a resistive component of an impedance of the coupled row of storage elements in the series arrangement to provide a first measured impedance and further operable to configure the interconnect circuit to couple the column of storage elements in the parallel arrangement and initiate measurement, by the impedance sensing circuit, of at least a resistive component of an impedance of the coupled column of storage elements in the parallel arrangement to provide a second measured impedance;

where the impedance sensing circuit is further operable to compare the first measured impedance with at least a resistive component of the first expected impedance and to compare the second measured impedance with at least a resistive component of the second expected impedance, where the row of storage elements is determined to be failed dependent upon a difference between the first measured impedance and the first expected impedance; and where the column of storage elements is determined to be failed dependent upon a difference between the second measured impedance and the second expected impedance.

2. The apparatus of claim 1, where the array of storage elements comprises a plurality of bitcells of a memory array.

3. The apparatus of claim 2, further comprising the memory array.

4. The apparatus of claim 2, further comprising a circuit configured to program bitcells of the memory array to a selected impedance state of the first and second impedance states in response to a global set signal or a global reset signal.

5. The apparatus of claim 2, where the memory array comprises a resistive random access memory (RRAM).

6. The apparatus of claim 2, where the memory array comprises an correlated electron random access memory (CeRAM).

7. The apparatus of claim 2, where the memory array further comprises one or more spare columns of bitcells, and where the interconnect circuit is further operable to couple to bitcells of the one or more spare columns.

8. The integrated circuit of claim 2, where the test controller is further operable to control a plurality of word lines of the memory array to enable selection or deselection of one or more rows of bitcells of the array.

9. The apparatus of claim 1, where a storage element of the plurality of storage elements comprises a correlated electron switch (CES).

10. The apparatus of claim 1, where the column of storage elements in the parallel arrangement are programmed to an expected high impedance state.

11. The apparatus of claim 1, where the row of storage elements in the series arrangement are programmed to an expected low impedance state.

12. The apparatus of claim 1, where the interconnect circuit comprises a plurality of analog switches.

13. The apparatus of claim 1, where the impedance sensing circuit is operable to measure the resistive component and a reactive component of the coupled storage elements.

14. The apparatus of claim 1, where the impedance sensing circuit comprises one or more reference resistors.

15. A non-transient computer readable medium containing instructions of a hardware description language representative of the integrated circuit of claim 1.

16. A method for testing a plurality of storage elements, a storage element of the plurality of storage elements comprising a variable impedance element designed to be set to a first impedance state by application of first programming signals and designed to be reset to a second impedance state by application of second programming signals, the method comprising:

applying first programming signals to the plurality of storage elements;

coupling at least some of the plurality of storage elements in a first arrangement, the first arrangement having a first expected impedance;

measuring at least a resistive component of an impedance of the first arrangement of coupled storage elements to provide a first measured impedance;

comparing the first measured impedance to the first expected impedance;

determining one or more storage elements of the plurality of storage elements to be failed dependent upon a difference between the first measured impedance and at least a resistive component of the first expected impedance;

applying second programming signals to the plurality of storage elements;

coupling at least some of the plurality of storage elements in a second arrangement, the second arrangement having a second expected impedance;

measuring at least a resistive component of an impedance of the second arrangement of coupled storage elements to provide a second measured impedance;

comparing the second measured impedance to at least a resistive component of the second expected impedance; and determining one or more storage elements of the plurality of storage elements to be failed dependent upon a difference between the second measured impedance and the at least the resistive component of the second expected impedance.

17. The method of claim 16, where the first measured impedance and the first expected impedance comprise resistance values and capacitance values.

18. A method for testing an array of storage elements, a storage element of the array comprising a variable impedance element designed to be set to a first impedance state by application of first programming signals and designed to be reset to a second impedance state by application of second programming signals, the method comprising:

testing a row of storage elements of the array by:
  applying first programming signals to at least the row of storage elements in the array;
  coupling the row of storage elements in a series arrangement, the series arrangement having a first expected impedance;
  measuring a resistive component of an impedance of the series arrangement;
  comparing the first measured impedance to a resistive component of the expected impedance of the series arrangement; and
  determining the row of storage elements to be failed dependent upon a difference between the measured impedance of the resistive component of the series arrangement and the first expected impedance; and
testing a column of storage elements of the array by:
  applying second programming signals to at least a column of storage elements in the array;
  coupling the column of storage elements in a parallel arrangement, the parallel arrangement having a second expected impedance;
  measuring a resistive component of an impedance of the parallel arrangement;
  comparing the measured resistive component of the impedance of the parallel arrangement to a resistive component of the second expected impedance; and
  determining the column of storage elements to be failed if a difference between the measured resistive component of the impedance of the parallel arrangement and the resistive component of the second expected impedance.

19. The method of claim 18, further comprising, when the row of storage elements is determined to be failed:

for one or more iterations:
  bypassing one or more storage elements in the row of storage elements;
  retesting the row of storage elements; and
  determining a storage element of the one or more bypassed storage elements in the row of storage elements to be failed if the retested row is not determined to be failed.

20. The method of claim 18, further comprising, when the column of storage elements is determined to be failed:

for one or more iterations:
  controlling word lines of the memory array to deselect one or more storage elements in the column of storage elements;
  retesting the column of storage elements; and
  determining a storage element of the one or more deselected storage elements in the column of storage elements to be failed if the retested column is not determined to be failed.

21. The method of claim 18, where coupling the row of storage elements in the series arrangement or coupling the column of storage elements in the parallel arrangement comprises configuring one or more switches of an interconnect circuit.

22. The method of claim 18, where the first programming signals and the second programming signals are applied simultaneously to all storage elements in the array.

23. The method of claim 18, further comprising replacing a row or column of the array containing a storage element determined to the failed with a spare row or column.

* * * * *